US 6,631,038 B1

(12) United States Patent
Spinali

(10) Patent No.: US 6,631,038 B1
(45) Date of Patent: Oct. 7, 2003

(54) CATADIOPTRIC LENS BARREL STRUCTURE HAVING A PLURALITY OF CONNECTING RODS FOR POSITIONING THE LENS BARREL STRUCTURE

(75) Inventor: Marc Spinali, Danville, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/636,061

(22) Filed: Aug. 10, 2000

(51) Int. Cl.⁷ .................................................. G02B 7/02
(52) U.S. Cl. ....................................................... 359/811
(58) Field of Search ................................ 359/694, 811, 359/819, 821

(56) References Cited

U.S. PATENT DOCUMENTS

| | | | |
|---|---|---|---|
| 3,722,996 A | 3/1973 | Fox | 355/53 |
| 4,826,424 A | 5/1989 | Arai et al. | 425/542 |
| 4,961,115 A | 10/1990 | Jessop | 348/374 |
| 4,998,821 A | 3/1991 | Ohta et al. | 353/122 |
| 5,137,349 A | * 8/1992 | Taniguchi et al. | 353/122 |
| 5,313,333 A | 5/1994 | O'Brien et al. | 359/820 |
| 5,576,895 A | 11/1996 | Ikeda | 359/811 |
| 5,586,818 A | * 12/1996 | Lee | 353/101 |
| 5,610,686 A | 3/1997 | Osanai | 355/72 |
| 5,708,534 A | * 1/1998 | Park | 359/822 |
| 5,734,499 A | * 3/1998 | Matsumoto et al. | 359/417 |
| 5,949,575 A | * 9/1999 | Matsumoto | 359/412 |
| 5,986,743 A | * 11/1999 | Hanzawa | 355/53 |
| 6,043,863 A | 3/2000 | Ikeda | 355/53 |

FOREIGN PATENT DOCUMENTS

WO WO99/27570 6/1999

* cited by examiner

Primary Examiner—Ricky Mack
(74) Attorney, Agent, or Firm—Finnegan, Henderson, Farabow, Garrett & Dunner, L.L.P.

(57) ABSTRACT

A catadioptric lens barrel structure for a projection exposure apparatus includes first and second lens barrels having parallel optical axes. The lens barrel structure also includes a third lens barrel transversely connecting the first lens barrel to the second lens barrel. A support structure firmly secures the plurality of lens barrels. The support structure includes a plurality of connecting rods for securing the first and second lens barrels, support platforms for individually supporting the lens barrels, and a plurality of flexures for resiliently supporting the lens barrel structure. The connecting rods are made of a material having a low coefficient of thermal expansion to minimize errors due to temperature changes, vibrational or rotational motion, and other conditions. Alternatively, the support structure may comprise a base support platform for firmly supporting base portions of the first and second lens barrels, and an upper support platform for flexibly supporting upper portions of the lens barrels. The base and upper support platforms are also made a material having a low coefficient of thermal expansion. In one embodiment, the lens barrel structure is used in semiconductor fabrication. A reticle is placed in front of an entrance end of the first lens barrel and a semiconductor wafer is placed in front of an exit end of the second lens barrel. A light beam passes through the reticle, travels through the lens barrel structure, and exposes a semiconductor wafer.

17 Claims, 4 Drawing Sheets

CATADIOPTRIC LENS BARREL STRUCTURE HAVING A PLURALITY OF CONNECTING RODS FOR POSITIONING THE LENS BARREL STRUCTURE

BACKGROUND OF THE INVENTION

1. Field of the Invention

This invention relates to a catadioptric lens barrel which can be attached to an optical projection unit, such as a projection exposure apparatus used to manufacture semiconductor wafers. More particularly, the present invention relates to a catadioptric lens barrel structure including its support structure, the lens barrel structure comprising a plurality of lens barrels aligned in parallel, and at least one transverse lens barrel connecting the plurality of lens barrels.

2. Description of the Related Art

A lens barrel is a tubular mechanical structure containing a series of lenses which are aligned to transfer an image from one end of the lens barrel to the other. The lens barrel may include a sturdy threaded body and durable metal retaining rings, often referred to as "sub-barrels," to carry a series of lens holders, commonly referred to as "cells." Another type of lens barrel is known as a catadioptric lens barrel. A catadioptric lens barrel contains not only refractive elements, such as lenses, but also reflective elements, such as mirrors.

Both of these lens barrel designs are used in conventional optical systems. For example, optical projection units often have a lens barrel and may be used in a projection exposure apparatus for production of semiconductor wafers. The projection exposure apparatus includes a template positioned near an entrance end of the lens barrel and a semiconductor wafer positioned near an exit end. The projection exposure apparatus shines light through the template, photographically reduces a pattern on the template, and sequentially transfers the pattern, through the lens barrel, onto a predetermined area on the semiconductor wafer. The template may be of a form such as a reticle or a mask. The semiconductor wafer is a silicon wafer with a photosensitive coating for making semiconductor devices, such as microprocessor or memory chips.

A catadioptric lens barrel system using two or more lens barrels, arranged in parallel, offers benefits not found in conventional single barrel systems. The parallelism of the lens barrels reduces the overall height of the lens barrel, but increases the overall width. Reduced height is important for many reasons, such as for ease of transport. This type of catadioptric lens barrel design, however, poses several problems. First, keeping proper alignment of a plurality of lens barrels can be difficult. Second, the focus depth of the projection system changes as temperature changes. Coefficients of thermal expansion of the lens barrels, including their internal components, and the indices of refraction of all lens materials vary with temperature. Errors related to these factors collectively alter the focusing properties of the optical system. Third, the lens barrel structure tends to be more sensitive to movement or vibration than conventional single barrel designs.

In light of the foregoing, there is a need for a catadioptric lens barrel structure that holds the lens barrels stably and accurately, and minimizes distortion errors due to temperature changes, vibrational, or other external forces, so that the resulting image remains focused as it is transferred and reduced from the reticle to the semiconductor wafer.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and in accordance with the purposes of the invention, as embodied and broadly described herein, one aspect of the invention is directed to a lens barrel structure. The lens barrel structure may be used, for example, in a projection exposure apparatus in semiconductor manufacturing to reduce a pattern on a reticle through the projection exposure apparatus to a semiconductor wafer. The lens barrel structure comprises a plurality of lens barrels and a plurality of support structures. Each lens barrel has an optical axis. The plurality of optical axes have a parallel orientation. The support structures are parallel to each other and perpendicular to the optical axes of the lens barrels. The support structures maintain the parallel orientation of the lens barrels. The support structures may comprise a first pair of connecting rods for supporting lower portions of the lens barrels, and a second pair of connecting rods for supporting upper portions of the lens barrels. Alternatively, the support structure may comprise a first support plate for supporting lower portions of the lens barrels, and a second support plate for supporting upper portions of the lens barrels. The support structures are made of a material having a low coefficient of thermal expansion.

The present invention is also directed to a lithography system comprising a lens barrel structure such as for use in a semiconductor manufacturing.

The present invention is further directed to a method for making a lens barrel structure, which, in one embodiment, is used in projection exposure apparatus in a semiconductor manufacturing to reduce a pattern on a reticle through the projection exposure apparatus to a semiconductor wafer. The method comprises the steps of disposing a plurality of lens barrels in a parallel orientation, and providing a plurality of support structures for maintaining the parallel orientation of the lens barrels.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like parts. The invention will be further clarified by the following examples, which are intended to be exemplary of the invention.

In one embodiment, a catadioptric lens barrel structure is provided with a plurality of lens barrels and a plurality of support structures. The support structures provide enhanced stability and are made of a material that reduces the effects of environmental changes on the lens barrel structure. The lens barrels run parallel to each other while the support structures maintain the parallel orientation of the lens barrels as well as minimize rotational or vibrational movement of the lens barrels. The support structures comprise a first pair of connecting rods for positioning lower portions of the lens barrels, and a second pair of connecting rods for positioning upper portions of the lens barrels.

In accordance with the invention, a catadioptric lens barrel structure is provided with a plurality of lens barrels. Each lens barrel has an optical axis along the length of the lens barrel. The plurality of optical axes run parallel to each other.

Figure 1:
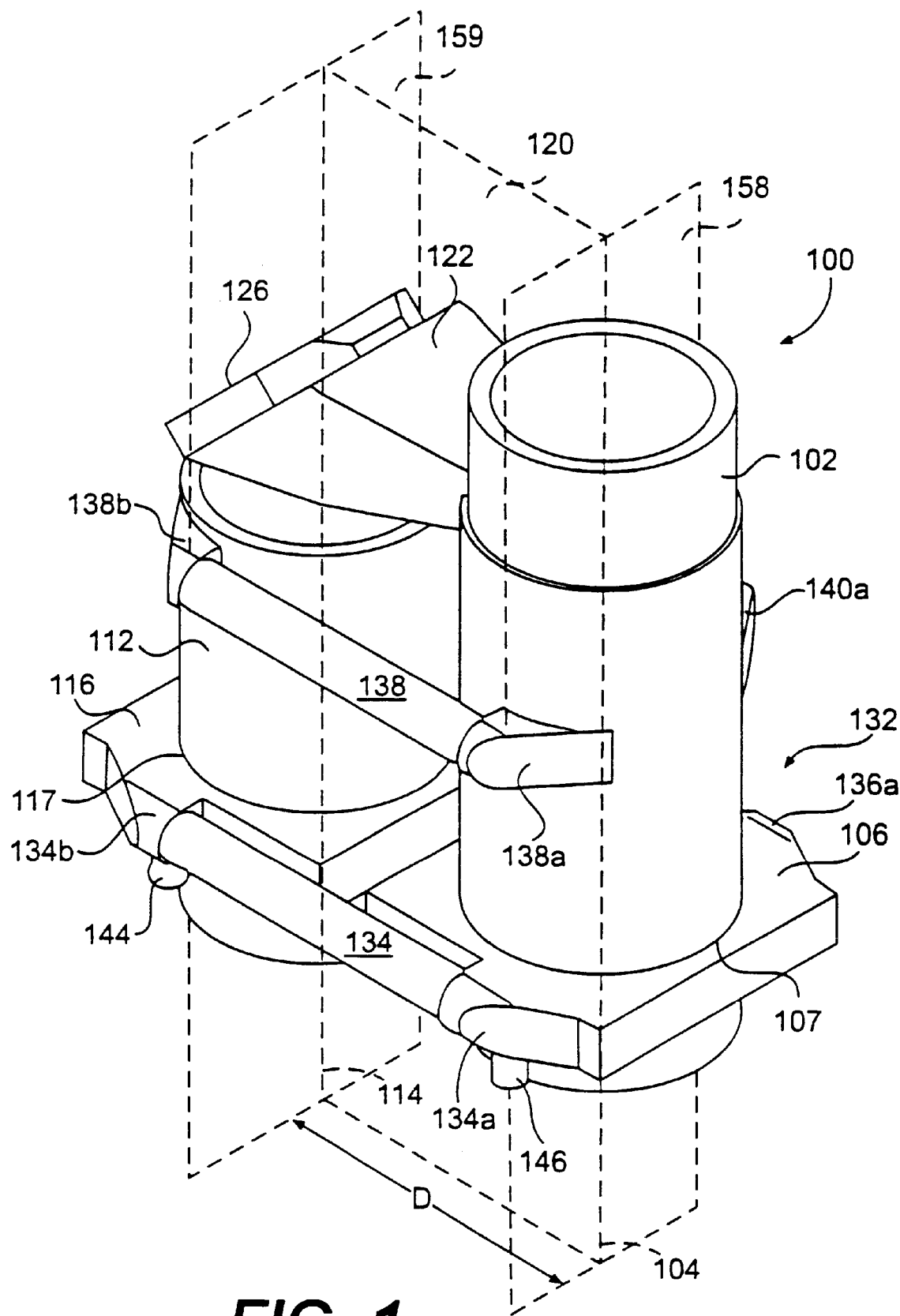
FIG. 1 is a perspective view showing a front side of the catadioptric lens barrel structure according to a first embodiment of the present invention.

In one embodiment, as illustrated in FIG. 1, a catadioptric lens barrel structure 100 comprises a pair of lens barrels including a first lens barrel 102 and a second lens barrel 112. First lens barrel 102 has a first optical axis 104 running along its length. Second lens barrel 112 has a second optical axis 114 running along its length. First and second optical axes 104, 114, respectively, run parallel to each other and define an imaginary frontal plane 120. First optical axis 104 and frontal plane 120 define a first optical plane 158 as a reference plane perpendicular to frontal plane 120 and passing through first optical axis 104. Similarly, second optical axis 114 and frontal plane 120 define a second optical plane 159 as a reference plane perpendicular to frontal plane 120 and passing through second optical axis 114.

Lens barrels 102 and 112 can be made of a rigid material, such as stainless steel or silicon carbide. For example, stainless steel commonly known in the industry as SS 17-7PH, SS 440 series, or SS 300 series may be used. Lens barrels 102 and 112 are quite large and heavy when used in a semiconductor production. For example, first lens barrel 102 may be as large as one meter (approximately 40 inches) in length, slightly less than a half meter (approximately 17 inches) in diameter, and weighing almost 500 kilograms (approximately 1100 pounds).

Figure 2:
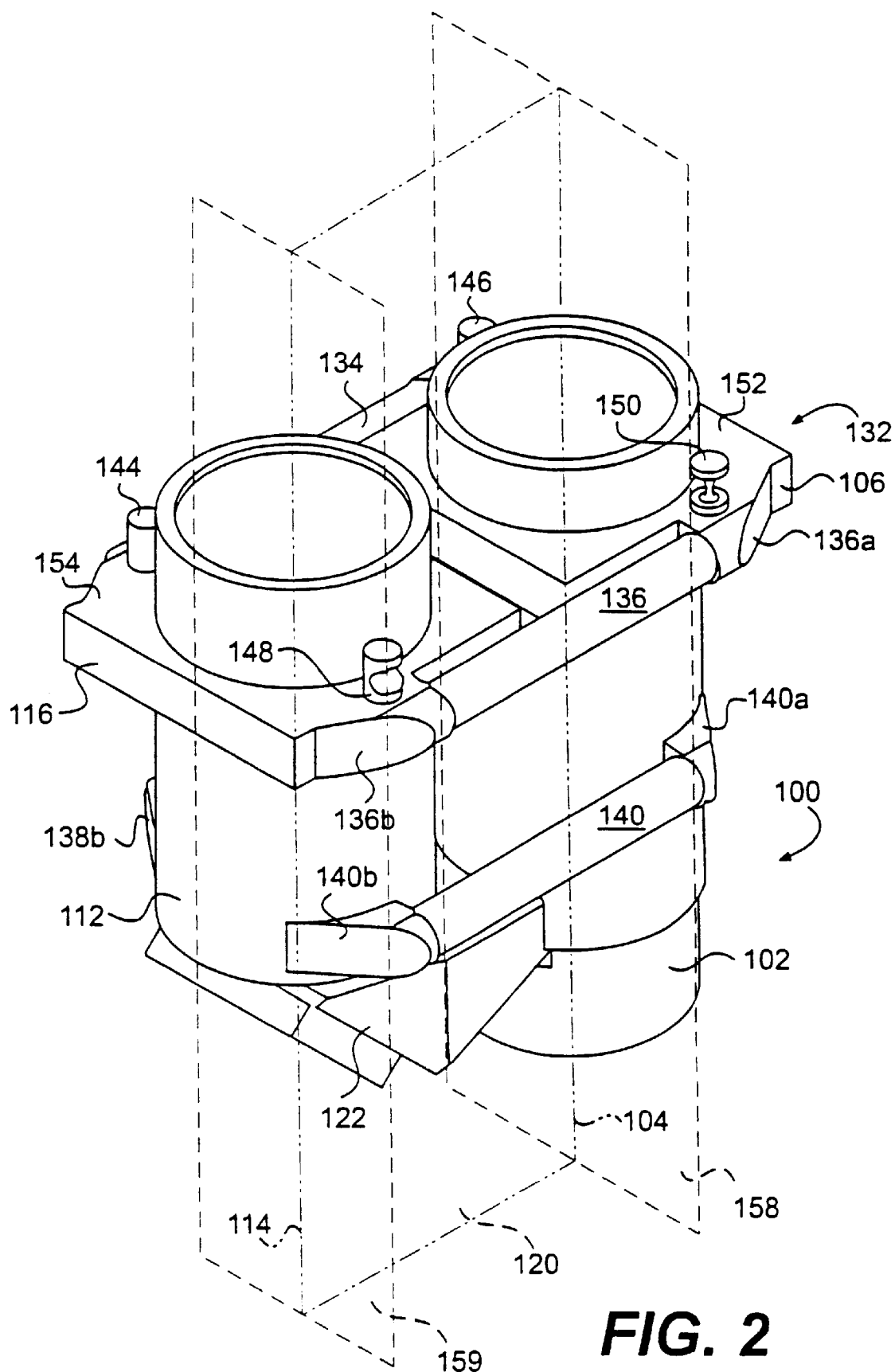
FIG. 2 is a perspective view showing a back side of the catadioptric lens barrel structure according to the first embodiment of the present invention.

First and second lens barrel, 102 and 112, respectively, may be constructed of several different types of lens barrels. A traditional lens barrel, for example, is a type of lens barrel where the barrel carries a plurality of lens holders (commercially known as "cells"), on which lenses are mounted. The plurality of lens holders are stacked in a serial orientation along the optical axis of the lens barrel. Another type of lens barrel comprises a series of sub-barrels connected end to end by fasteners. FIGS. 1 and 2 show first and second lens barrels 102 and 112 as the traditional lens barrel type.

Consistent with the principles of the invention, a catadioptric lens barrel structure is provided with at least one transverse lens barrel connecting one lens barrel to the next successive lens barrel. Each transverse lens barrel comprises at least two reflective elements. The reflective elements are angularly oriented. The reflective elements reflect an image of the reticle reflected off a reflective element in front of an exit end of the first lens barrel to the second lens barrel and onto a wafer in front of an exit end of the second lens barrel.

Figure 3:
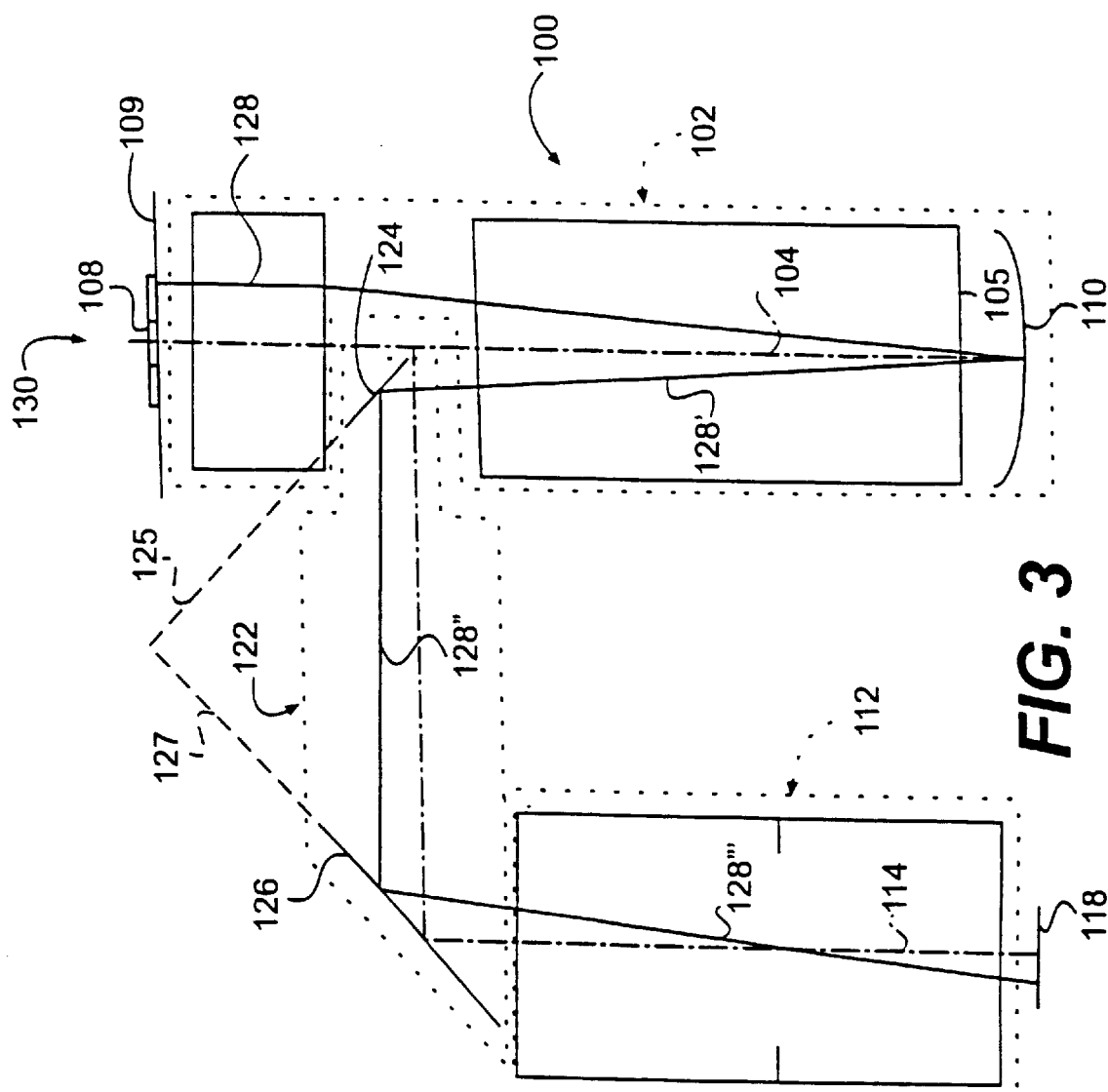
FIG. 3 is a schematic diagram of the catadioptric lens barrel structure consistent with the principles of the present invention.

As shown in FIG. 1, catadioptric lens barrel structure 100 comprises, for exemplary purposes, a transverse lens barrel 122 connecting first lens barrel 102 to second lens barrel 112. Transverse lens barrel 122 carries therein, for example, a pair of mirrors 124 (not shown in FIG. 1) and 126. As best shown in FIG. 3, mirror 124 is located inside first lens barrel 102. Mirrors 124 and 126 have angular orientations. Mirrors 124, 126, reticle 108, and semiconductor wafer 118 are discussed in greater detail below with respect to FIG. 3. Transverse lens barrel 122 is preferably made of a material having a low coefficient of thermal expansion. For example, the coefficient of thermal expansion may be as low as 6 ppm/° C. or below. Table 1 below shows some examples of materials having this property.

TABLE 1

| Materials | Coefficients of Thermal Expansion |
| --- | --- |
| Alumina Ceramic ($Al_2O_3$) | 5.7 ppm/° C. |
| Invar | 0.64–3.11 ppm/° C. (depending on heat treatment) |
| Ultra Low Expansion glass (ULE ™) | 0.03 ppm/° C. |
| Zerodur | 0.05 ppm/° C. |
| Silicon Carbide (SiC) | 0.4–5.1 ppm/° C. (depending on temperature range) |

The purpose of using low expansion materials for transverse lens barrel 122 is to minimize errors related to distortion of the lens barrel structure 100 due to environmental changes. The distortion may include, for example, expansion or contraction due to temperature changes, rotational and vibrational motion, or other motion caused by other external forces. When temperature changes, either increases or decreases, each part of the lens barrel structure will expand or contract accordingly. The change in length can be mathematically determined according to this expression:

$$\Delta L = \alpha \cdot L \cdot \Delta T$$

whereby $\alpha$ is the coefficient of thermal expansion of the part; L is the initial length of the part; and $\Delta T$ is the temperature difference as final temperature is subtracted from initial temperature. A coefficient of thermal expansion of a material represents a characteristic of the material in response to thermal changes, and is measured in parts per million for every centigrade of temperature gradient (ppm/° C.). By selecting materials having extremely low coefficients of thermal expansion, each part will expand or contract very minimally.

Also consistent with the principles of the invention, a catadioptric lens barrel structure is provided with a plurality of support structures. In a first embodiment, the support structures comprise a first pair of connecting rods positively positioning base portions of the lens barrels and a second pair of connecting rods positively positioning upper portions of the lens barrels.

According to the first embodiment of the invention, as shown in FIGS. 1 and 2, a catadioptric lens barrel structure is provided with a plurality of support structures 132. Support structures 132 include a first pair of connecting rods 134 and 136, and a second pair of connecting rods 138 and 140. Connecting rods 134 and 138 are located on a front side of the lens barrel structure 100. Connecting rods 136 and 140, shown in FIG. 2, are located on a back side of the lens barrel structure 100. First and second pairs of connecting rods 134, 136, 138, and 140, respectively, run parallel to each other and perpendicular to first and second optical axes 104, 114, respectively. The first pair of connecting rods 134, 136 position base portions of first and second lens barrels 102, 112, respectively. The second pair of connecting rods 138, 140 position upper portions of first and second lens barrels 102, 112, respectively. First pair of connecting rods 134 and 136 are preferably positioned as high as possible across second lens barrel 112 to provide optimum support to the lens barrel structure 100.

First and second pairs of connecting rods 134, 136, 138, and 140 are preferably made of a material having a low coefficient of thermal expansion. For example, the coefficient of thermal expansion may be as low as 6 ppm/° C. or below. Similar to the materials for transverse lens barrel 122, selection of materials having this property includes alumina ceramic ($Al_2O_3$), Invar, ULE™ glass, Zerodur glass, and silicon carbide (SiC). The same reasons for selecting these materials have been discussed above with respect to Table 1.

Therefore, first and second pairs of connecting rods 134, 136, 138, and 140, respectively, along with transverse lens barrel 122, substantially maintain the distance D between first and second optical axes 104, 114, respectively, regardless of temperature changes. Consistent with the principles of the invention, distance D is a key parameter of a catadioptric lens barrel system having parallel lens barrels construction. First and second pairs of connecting rods 134, 136, 138, and 140, respectively, are made of the same material selected from Table 1 so that they will expand or contract, if at all, at the same rate, thus maintaining the distance D substantially constant. Therefore, first and second pairs of connecting rods 134, 136, 138, and 140, respectively, maintain first and second lens barrels 102 and 112, respectively, substantially parallel, and maintain distance D substantially constant. Transverse lens barrel 122 is also made of a material selected from Table 1, and preferably, although not necessarily, of the same material as connecting rods 134, 136, 138, and 140. If transverse lens barrel 122 is made of a different material than the connecting rods 134, 136, 138, and 140, then some kind of adjustment mechanism will be needed. Such adjustment mechanism may include a set of flexures (not shown) located inside transverse lens barrel 122.

Also consistent with the principles of the invention, the support structures comprise a plurality of sets of clamps and a plurality of support platforms. Each set of clamps attaches to both ends of each connecting rod to fasten the connecting rod to the plurality of lens barrels. Each support platform supports a lens barrel.

As shown in FIGS. 1 and 2, support structure 132 is provided with four pairs of clamps 134a and 134b, 136a and 136b, 138a and 138b, 140a and 140b, and a pair of support platforms 106 and 116. Each pair of clamps 134a and 134b, 136a and 136b, 138a and 138b, or 140a and 140b, attach to both ends of a connecting rod 134, 136, 138, or 140, respectively, to fasten the connecting rod 134, 136, 138, or 140, to the first and second lens barrels 102, 112, respectively. First support platform 106 has an opening 107 to accommodate and to support first lens barrel 102. Second support platform 116 has an opening 117 to accommodate and to support second lens barrel 112. Openings 107 and 117 preferably are slightly larger than first and second lens barrels 102 and 112, respectively, to allow clearance for the lens barrels 102 and 112 to expand and contract. Support structures 132 may further include flanges (not shown) to secure first and second lens barrels 102, 112, respectively, to first and second support platforms 106, 116, respectively.

Clamp 134a fastens one end of connecting rod 134 to first support platform 106. Clamp 136a fastens one end of connecting rod 136 to first support platform 106. Clamps 134a and 136a may be formed as an integral part of support platform 106. Similarly, clamp 134b fastens the other end of connecting rod 134 to second support platform 116. Clamp 136b fastens the other end of connecting rod 136 to second support platform 116. Clamps 134b and 136b may be formed as an integral part of support platform 116.

Clamps 134a and 134b, 136a and 136b, 138a and 138b, 140a and 140b, are configured to facilitate connecting rods 134, 136, 138, and 140 in maintaining distance D. Clamps 138a and 140a are preferably positioned on opposing peripheries of first lens barrel 102 aligned with first optical plane 158. Clamps 134a and 136a are preferably positioned on opposing edges of first support platform 106 also aligned with first optical plane 158. Similarly, clamps 138b and 140b are preferably positioned on opposing peripheries of second lens barrel 112 aligned with second optical plane 159. Clamps 134b and 136b are preferably positioned on opposing edges of second support platform 116 aligned with second optical plane 159.

Further consistent with the principles of the invention, the support structures comprise a plurality of flexures attachable to lower faces of the support platforms for resiliently supporting the lens barrel structure. In one embodiment, the plurality of flexures comprise four types of flexures. A first flexure is a rigid mounting. A second flexure has one degree of freedom in a direction parallel to the connecting rods. A third flexure has one degree of freedom in a direction perpendicular to the connecting rods. A fourth flexure has two degrees of freedom in the directions parallel and perpendicular to the connecting rods.

FIGS. 1 and 2 show support structure 132 comprising a plurality of flexures 144, 146, 148, and 150. Flexures 144, 146, 148, and 150, are attachable to lower faces 152 and 154 of support platforms 106 and 116, respectively, for resiliently supporting lens barrel structure 100. Flexures 144, 146, 148, and 150 promote flexibility in allowing lens barrel structure 100 to move when, for instance, the temperature changes, thus preventing lens barrel structure 100 from distorting or buckling. A first flexure 144 is a rigid mounting. A second flexure 146 has one degree of freedom in a direction parallel to connecting rods 134, 136, 138, and 140. Second flexure 146 allows lens barrel structure 100 to expand or contract in the direction parallel to connecting rods 134, 136, 138, 140, as they expand or contract. A third flexure 148 has one degree of freedom in a direction perpendicular to connecting rods 134, 136, 138, and 140. Third flexure 148 allows lens barrel structure 100 to expand or contract in the direction perpendicular to connecting rods 134, 136, 138, and 140, as lens barrels 102 and 112, and support platforms 106 and 116, expand or contract. A fourth flexure 150 has two degrees of freedom in the directions parallel and perpendicular to connecting rods 134, 136, 138, and 140. Fourth flexure 150 allows lens barrel structure 100 to expand or contract in both directions parallel and perpendicular to connecting rods 134, 136, 138, and 140, as the whole lens barrel structure 100 expand or contract.

In one embodiment, first flexure 144 is preferably attached on lower surface 154 of second support platform 116, aligned with second optical plane 159, and located as close to a periphery of second lens barrel 112 as possible. Fourth flexure 150 is attached on lower surface 152 of first support platform 106, aligned with first optical plane 158, and located as close to a periphery of first lens barrel 102 as possible, and on a diagonally opposing corner from first flexure 144. Second flexure 146 is attached on lower surface 152 of first support platform 106, aligned with first optical plane 158, and located on a diametrically opposing periphery of first lens barrel 102 from fourth flexure 150. Third flexure 148 is attached on lower surface 154 of second support platform 116, aligned with second optical plane 159, and located on a diametrically opposing periphery of second lens barrel 112 from first flexure 144. FIGS. 1 and 2 show first flexure 144 located in front of second lens barrel 112 along second optical plane 159, while fourth flexure 150 is located behind first lens barrel 102 along first optical plane 158. FIGS. 1 and 2 also show second flexure 146 located in front of first lens barrel 102 along first optical plane 158, while third flexure 148 is located behind second lens barrel 112 along second optical plane 159.

The configuration of flexures 144, 146, 148, and 150 may be rotated around the four corners pursuant to the following three guidelines. One, first and fourth flexures, 144 and 150, respectively, are located on diagonally opposing corners. Two, second flexure 146 is located on a logical anchor position facilitating lens barrel structure 100 to move in a direction parallel to connecting rods 134, 136, 138, and 140. Three, third flexure 148 is located on a logical anchor position facilitating lens barrel structure 100 to move in a direction perpendicular to connecting rods 134, 136, 138, and 140.

Therefore, when temperature changes, lens barrels 102 and 112, as well as support platforms 106 and 116, will expand or contract accordingly. However, connecting rods 134, 136, 138, and 140, will substantially maintain distance D and control rotational motion of the lens barrels 102 and 112, while flexures 144, 146, 148, and 150 will allow the whole lens barrel structure 100 to expand or contract, thus, preventing the lens barrel structure 100 from distorting or buckling.

FIG. 3 illustrates the path of exemplary light beam 128 through lens barrel structure 100 as discussed with respect to FIGS. 1 and 2. Light source 130 illuminates reticle 108. Reticle 108 is shown as placed on an image plane 109. Light source 130 enters first lens barrel 102. A reflective element 110, such as a mirror, is provided and positioned in front of an exit end 105 of first lens barrel 102 on an opposing end of reticle 108. Mirror 110 preferably has an optical axis which is aligned with first optical axis 104. Light beam 128 is reflected off of mirror 110, illustrated as light beam 128'. Light beam 128' travels back through first lens barrel 102. Light beam 128' then hits mirror 124 carried inside transverse lens barrel 122, is reflected off of mirror 124, as light beam 128", and is reflected off of mirror 126, as light beam 128'". Light beam 128'" travels through second lens barrel 112 and hits wafer 118. Mirrors 124 and 126 are preferably oriented at 45° angle from light beams 128' and 128", respectively. Therefore, in this embodiment if imaginary extension lines 125 and 127 are drawn from mirrors 124 and 126, respectively, it will be shown that mirrors 124 and 126 are perpendicular to each other.

In a second embodiment, the catadioptric lens barrel structure is also provided with a plurality of lens barrels such as shown in FIGS. 1 and 2. The plurality of support structures according to the second embodiment comprise a base support plate and an upper support plate, replacing the first and second pairs of connecting rods. The base support plate supports lower portions of the lens barrels, and the upper support plate supports upper portions of the lens barrels.

Similar to the first embodiment, a catadioptric lens barrel structure is provided with a plurality of lens barrels. Each lens barrel has an optical axis running along the length of its corresponding lens barrel. The plurality of optical axes run parallel to each other.

Figure 4:
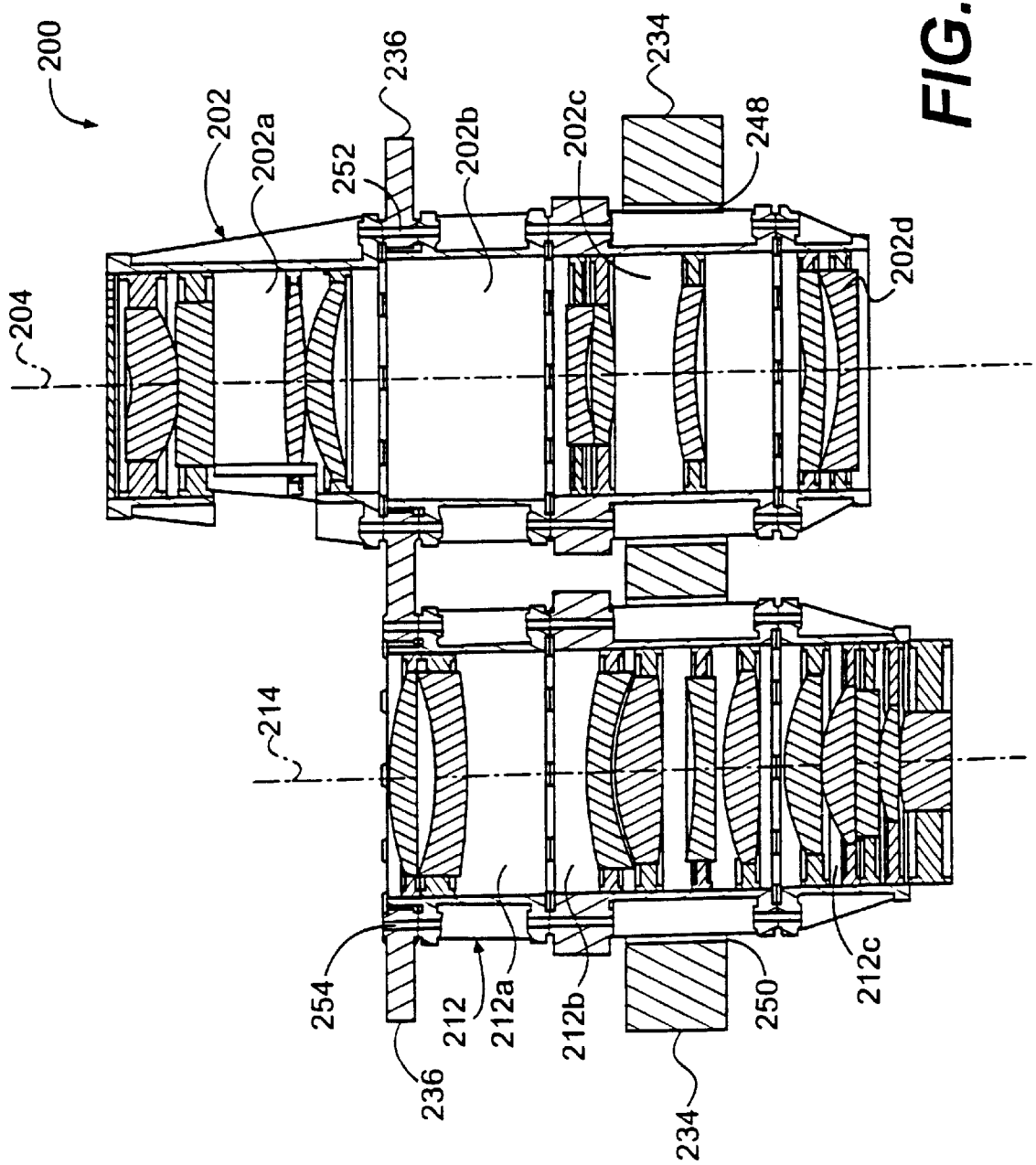
FIG. 4 is a sectional front view of the catadioptric lens barrel structure according to a second embodiment of the present invention.

In the second embodiment illustrated in FIG. 4, a catadioptric lens barrel structure 200 comprises a pair of lens barrels including a first lens barrel 202 and a second lens barrel 212, and a plurality of support structures 232. Support structures 232 comprise a base support plate 234 and an upper support plate 236, instead of the connecting rods 134, 136, 138, and 140, as shown in FIGS. 1 and 2. First and second lens barrels 202 and 212, respectively, are similar to first and second lens barrels 102 and 112, respectively, according to the first embodiment. First lens barrel 202 has a first optical axis 204 running along its length. Similarly, second lens barrel 212 has a second optical axis 214 running along its length. First and second lens barrels, 202 and 212, respectively, are shown to be a sub-barrel type. First lens barrel 202 comprises sub-barrels 202a, 202b, 202c, and 202d. Each sub-barrel 202a, 202b, 202c, or 202d, carries a plurality of cells, each cell holding a lens. Second lens barrel 212 comprises sub-barrels 212a, 212b, and 212c. Each sub-barrel 212a, 212b, or 212c, carries a plurality of cells, each cell holding a lens. As explained with respect to the first embodiment, first and second lens barrel 202, 212, respectively, can also be made of a rigid material, such as silicon carbide or stainless steel. For example, the barrel may be made of SS 17-7 PH, SS 440 series, or SS 300 series. Similar to the first embodiment as shown in FIGS. 1 and 2, lens barrel structure 200 may also comprise a transverse lens barrel (not shown) connecting first lens barrel 202 to second lens barrel 212. The transverse lens barrel carries a pair of angularly oriented mirrors (not shown) to reflect an image of the reticle from first lens barrel 202 to second lens barrel 212 and onto the semiconductor wafer in front of an exit end of the second lens barrel 212.

Further consistent with the principles of the invention, the catadioptric lens barrel structure may also be provided with a plurality of support structures. The support structures include a base support plate and an upper support plate. The base and upper support plates run parallel to each other and perpendicular to the first and second optical axes. Each support plate has a plurality of openings to accommodate and to support the corresponding plurality of lens barrels. The base support plate preferably has sufficient thickness to support the lens barrels. The upper support plate is preferably thinner than the base support plate. The upper support plate provides flexibility and controls rotation of the lens barrels, thus, preventing distortion of the lens barrel structure. The support structures are made of a material having a low coefficient of thermal expansion.

In the embodiment illustrated in FIG. 4, catadioptric lens barrel structure 200 is provided with support structures 232. Support structures 232 include a base support plate 234 and an upper support plate 236. Base and upper support plates, 234 and 236, respectively, run parallel to each other and perpendicular to first and second optical axes, 204 and 214, respectively. In the embodiment shown, base support plate 234 has sufficient thickness to support base portions of first and second lens barrels, 202 and 212, respectively. Upper support plate 236 is thinner than base support plate 234, thus providing flexibility and control of rotation of the lens barrels. Therefore, upper support plate 236 prevents distortion of lens barrel structure 200. Base support plate 234 has a first opening 248 and a second opening 250 to accommodate and support the corresponding first and second lens barrels, 202 and 212, respectively. Upper support plate 236 has a first opening 252 and a second opening 254 to accommodate and support the corresponding first and second lens barrels, 202 and 212, respectively.

Base support plate 234 and upper support plate 236 are preferably made of a material having a low coefficient of thermal expansion. For example, the coefficient of thermal expansion may be as low as 6 ppm/° C. or below. The transverse lens barrel is also preferably made of a material having a low coefficient of thermal expansion. For example, the coefficient of thermal expansion may be as low as 6 ppm/° C. or below. Table 1 above shows examples of materials having this property.

It will be apparent to those skilled in the art that various modifications and variations can be made in the catadioptric lens barrel structure, the material chosen for the present invention, and in construction of the number of lens barrels arrangement and the support structure as well as other aspects of the invention without departing from the scope or spirit of the invention. Although the support structures according to the first embodiment comprise a plurality of connecting rods, while according to the second embodiment comprise a pair of support plates, these support structures may be used in combination. For instance, the support structures may use a base support plate to support the base portions of the lens barrel, and use a pair of connecting rods to support the upper portions of the lens barrels.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

I claim:

1. A lens barrel structure, comprising:
   a plurality of lens barrels, each lens barrel having an optical axis, the plurality of optical axes having a parallel orientation; and
   a plurality of support structures parallel to each other and perpendicular to the optical axes of the lens barrels for maintaining the parallel orientation of the lens barrels,
   wherein the support structures are made of a material having a coefficient of thermal expansion of 6 ppm/° C. or below.

2. A lithography system, comprising a lens barrel structure as claimed in claim 1.

3. The lens barrel structure of claim 2, wherein the material is selected from the group consisting of alumina ceramic, Ultra Low Expansion glass, Zerodur glass, silicon carbide, and Invar.

4. A lens barrel structure, comprising:
   a plurality of lens barrels, each lens barrel having an optical axis, the plurality of optical axes having a parallel orientation; and
   a plurality of support structures parallel to each other and perpendicular to the optical axes of the lens barrels for maintaining the parallel orientation of the lens barrels, the support structures comprising a first support plate for supporting lower portions of the lens barrels and a second support plate for supporting upper portions of the lens barrels.

5. The lens barrel structure of claim 4, wherein:
   the first support plate has sufficient thickness to support the lens barrels; and
   the second support plate has sufficient thickness and flexibility to minimize distortion of the lens barrels.

6. A lens barrel structure, comprising:
   a plurality of lens barrels, each lens barrel having an optical axis, the plurality of optical axes having a parallel orientation; and
   a plurality of support structures parallel to each other and perpendicular to the optical axes of the lens barrels for maintaining the parallel orientation of the lens barrels, the support structures comprising a first pair of connecting rods for positioning lower portions of the lens barrels and a second pair of connecting rods for positioning upper portions of the lens barrels.

7. The lens barrel structure of claim 6, wherein the support structures further comprise:
   a plurality of support platforms corresponding to the plurality of lens barrels, each support platform supporting the lower portion of the corresponding lens barrel;
   a first set of clamps for clamping the plurality of support platforms to the corresponding plurality of lens barrels; and
   a second set of clamps for clamping the second pair of connecting rods to the lens barrels.

8. The lens barrel structure of claim 7, wherein:
   each of the plurality of lens barrels comprises an optical axis running along the length of the corresponding lens barrel, the plurality of optical axes define a frontal plane, and the frontal plane with the plurality of optical axes define a corresponding plurality of optical planes, each optical plane being perpendicular to the frontal plane passing through the corresponding optical axis;
   each set of clamps is positioned on opposing peripheries of the corresponding lens barrel along the corresponding optical plane.

9. The lens barrel structure of claim 6, wherein the support structures further comprise:
   a plurality of support platforms corresponding to the plurality of lens barrels, each support platform supporting the lower portion of the corresponding lens barrel; and
   a plurality of flexures attached to the support platforms for resiliently supporting the lens barrels.

10. The lens barrel structure of claim 9, wherein the plurality of flexures comprise:
    a first flexure comprised of a rigid mounting;
    a second flexure having one degree of freedom in a direction parallel to the connecting rods;
    a third flexure having one degree of freedom in a direction perpendicular to the connecting rods; and
    a fourth flexure having two degrees of freedom in the directions parallel and perpendicular to the connecting rods.

11. The lens barrel structure of claim 10, wherein:
    the plurality of lens barrels comprise:
      a first lens barrel having a first optical axis running along the length of the first lens barrel,
      a second lens barrel having a second optical axis running along the length of the second lens barrel, wherein
    the first and second optical axes define a frontal plane,
    the frontal plane and the first optical axis define a first optical plane perpendicular to the frontal plane passing through the first optical axis,
    the frontal plane and the second optical axis define a second optical plane perpendicular to the frontal plane passing through the second optical axis; and
    the first and third flexures are located near opposing peripheries of one of the first or second lens barrel along the corresponding optical plane; and the second and fourth flexures are located near opposing peripheries of the other one of the first or second lens barrel along the corresponding optical plane.

12. A method for making a lens barrel structure, comprising the steps of:
   disposing a plurality of lens barrels in a parallel orientation; and
   providing a plurality of support structures for maintaining the parallel orientation of the lens barrels,
   wherein the step of providing a plurality of support structures further comprises:
      supporting upper portions of the lens barrels;
      supporting lower portions of the lens barrels;
      controlling the distance separating one lens barrel to the next lens barrel; and
      restraining rotational movement of the lens barrels.

13. A method for making a lens barrel structure, comprising the steps of:
   disposing a plurality of lens barrels in a parallel orientation; and
   providing a plurality of support structures for maintaining the parallel orientation of the lens barrels,
   wherein the support structures are made of a material having a coefficient of thermal expansion of 6 ppm/° C. or below.

14. The method of claim 13, wherein the material is selected from the group consisting of alumina ceramic, Ultra Low Expansion glass, Zerodur glass, silicon carbide, and Invar.

15. A method for making a lens barrel structure, comprising the steps of:
   disposing a plurality of lens barrels in a parallel orientation;
   providing a plurality of support structures for maintaining the parallel orientation of the lens barrels; and
   providing a plurality of flexures for resiliently supporting the lens barrel structure.

16. The method of claim 15, wherein the step of providing a plurality of flexures comprises:
   rigidly supporting a first anchor position of the lens barrel structure;
   resiliently supporting a second anchor position of the lens barrel structure in a direction parallel to the support structures;
   resiliently supporting a third anchor position of the lens barrel structure in a direction perpendicular to the support structures; and
   resiliently supporting a fourth anchor position of the lens barrel structure in the directions parallel and perpendicular to the support structures.

17. The method of claim 16, wherein the step of disposing a plurality of lens barrels further comprises:
   defining a plurality of optical axes running along the length of the corresponding plurality of lens barrels;
   defining a frontal plane passing through the plurality of optical axes;
   defining a plurality of optical planes perpendicular to the frontal plane and passing through the corresponding plurality of optical axes; and
   positioning the plurality of flexures on opposing peripheries of the plurality of lens barrels along the corresponding optical planes, the first and second anchor positions being aligned with one of the plurality of optical planes, the second and fourth anchor positions being aligned with another one of the plurality of optical planes.

* * * * *

UNITED STATES PATENT AND TRADEMARK OFFICE
CERTIFICATE OF CORRECTION

PATENT NO. : 6,631,038 B1
DATED : October 7, 2003
INVENTOR(S) : Marc Spinali

It is certified that error appears in the above-identified patent and that said Letters Patent is hereby corrected as shown below:

<u>Column 9, line 34 through Column 12 line 35,</u>
Delete the claims in their entirety and substitute therefor:

-- 1. An apparatus, comprising:

a first lens barrel defining a first optical axis;

a second lens barrel defining a second optical axis; and a support structure comprising:

a first pair of connecting rods connected to the first and second lens barrels at first portions of the first and second lens barrels for positioning the first portions of the first and second lens barrels; and a second pair of connecting rods connected to the first and second lens barrels at second portions axially spaced from the first portions of the first and second lens barrels for positioning the second portions of the first and second lens barrels, wherein the support structure is configured to support the first and second lens barrels.

2. The apparatus of claim 1, wherein the support structure is mechanically attached to the first and second lens barrels at points where any thermal expansion or contraction of the first and second lens barrels caused by temperature changes does not cause a substantial change in the positions of the first and second optical axes.

3. The apparatus of claim 1, wherein the support structure is made of a material having a coefficient of thermal expansion of 6 ppm/°C or below.

4. The apparatus of claim 3, wherein the material is at least one of alumina ceramic, Ultra Low Expansion glass, Zerodur glass, silicon carbide, and Invar.

5. The apparatus of claim 1, wherein the support structure further comprises:

a first support plate for supporting lower portions of the first and second lens barrels; and a second support plate for supporting upper portions of the first and second lens barrels.

6. The apparatus of claim 5, wherein:

the first support plate has sufficient thickness to support the first and second lens barrels; and the second support plate has sufficient thickness and flexibility to minimize distortion of the first and second lens barrels.

7. The apparatus of claim 1, wherein the first portions are lower portions of the first and second lens barrels and the second portions are upper portions of the first and second lens barrels.

8. The apparatus of claim 7, wherein the support structure further comprises:

first and second support platforms supporting, respectively, the lower portions of the first and second lens barrel;

a first set of clamps for clamping the first and second support platforms to the first and second lens barrel; and a second set of clamps for clamping the second pair of connecting rods to the first and second lens barrels.

9. The apparatus of claim 8, wherein:

the first and second optical axes define a frontal plane;

the frontal plane and the first optical axis define a first optical plane being perpendicular to the frontal plane and passing through the first optical axis;

the frontal plane and the second optical axis define a second optical plane being perpendicular to the frontal plane and passing through the second optical axis; and the first and second sets of clamps are positioned on opposing peripheries of the first and second lens barrels along the first and second optical planes.

UNITED STATES PATENT AND TRADEMARK OFFICE
CERTIFICATE OF CORRECTION

PATENT NO. : 6,631,038 B1
DATED : October 7, 2003
INVENTOR(S) : Marc Spinali

It is certified that error appears in the above-identified patent and that said Letters Patent is hereby corrected as shown below:

10. The apparatus of claim 7, wherein the support structure further comprises:

first and second support platforms supporting, respectively, the lower portions of the first and second lens barrels; and a plurality of flexures attached to the first and second support platforms for resiliently supporting the first and second lens barrels.

11. The apparatus of claim 10, wherein the plurality of flexures comprise:

a first flexure comprised of a rigid mounting;

a second flexure having one degree of freedom in a direction parallel to the connecting rods;

a third flexure having one degree of freedom in a direction perpendicular to the connecting rods; and a fourth flexure having two degrees of freedom in the directions parallel and perpendicular to the connecting rods.

12. The apparatus of claim 11, wherein:

the first and second optical axes define a frontal plane;

the frontal plane and the first optical axis define a first optical plane being perpendicular to the frontal plane and passing through the first optical axis;

the frontal plane and the second optical axis define a second optical plane being perpendicular to the frontal plane and passing through the second optical axis;

the first and third flexures are located near opposing peripheries of one of the first and second lens barrels along the corresponding optical plane; and the second and fourth flexures are located near opposing peripheries of the other of the first and second lens barrel along the corresponding optical plane.

13. A lithography system, comprising the apparatus as claimed in claim 1.

14. A method for making an apparatus, comprising the steps of:

providing a first lens barrel defining a first optical axis;

providing a second lens barrel defining a second optical axis; and supporting the first and second lens barrels with a support structure comprising:

a first pair of connecting rods connected to the first and second lens barrels at first portions of the first and second lens barrels for positioning the first portions of the first and second lens barrels; and a second pair of connecting rods connected to the first and second lens barrels at second portions axially spaced from the first portions of the first and second lens barrels for positioning the second portions of the first and second lens barrels.

15. The method of claim 14, further comprising the step of mechanically attaching the support structure to the first and second lens barrels at points where any thermal expansion or contraction of the first and second lens barrels caused by temperature changes does not cause a substantial change in the positions of the first and second optical axes.

16. The method of claim 14, wherein the support structure is made of a material having a coefficient of thermal expansion of 6 ppm/°C or below.

17. The method of claim 16, wherein the material is at least one of alumina ceramic, Ultra Low Expansion glass, Zerodur glass, silicon carbide, and Invar.

18. The method of claim 14, wherein the step of supporting the first and second lens barrels comprises:

supporting upper portions of the first and second lens barrels; and supporting lower portions of the first and second lens barrels.

19. The method of claim 18, wherein the step of supporting the first and second lens barrels further comprises restraining rotational movement of the first and second lens barrels.

20. The method of claim 14, further comprising the step of resiliently supporting the apparatus with a plurality of flexures.

21. The method of claim 20, wherein the step of resiliently supporting the apparatus comprises:

rigidly supporting a first anchor position of the apparatus;

resiliently supporting a second anchor position of the apparatus in a direction parallel to the support structure;

resiliently supporting a third anchor position of the apparatus in a direction perpendicular to the support structure; and

UNITED STATES PATENT AND TRADEMARK OFFICE
CERTIFICATE OF CORRECTION

PATENT NO. : 6,631,038 B1
DATED : October 7, 2003
INVENTOR(S) : Marc Spinali

It is certified that error appears in the above-identified patent and that said Letters Patent is hereby corrected as shown below:

resiliently supporting a fourth anchor position of the lens barrel structure in the directions parallel and perpendicular to the support structure.

22. The method of claim 21, wherein the step of resiliently supporting the apparatus further comprises:

defining a frontal plane passing through the first and second optical axes;

defining a first optical plane perpendicular to the frontal plane and passing through the first optical axis;

defining a second optical plane perpendicular to the frontal plane and passing through the second optical axis; and positioning the plurality of flexures on opposing peripheries of the first and second lens barrels along the first and second optical planes, the first and third anchor positions being aligned with one of the first and second optical planes, the second and fourth anchor positions being aligned with the other of the first and second optical planes.

23. The apparatus of claim 1, wherein a coefficient of thermal expansion of the support structure is less than a coefficient of thermal expansion of the first and second lens barrels.

24. The method of claim 14, wherein a coefficient of thermal expansion of the support structure is less than a coefficient of thermal expansion of the first and second lens barrels.--.

Signed and Sealed this

Thirtieth Day of March, 2004

JON W. DUDAS
*Acting Director of the United States Patent and Trademark Office*